US011395530B2

(12) United States Patent
Gloyer et al.

(10) Patent No.: US 11,395,530 B2
(45) Date of Patent: Jul. 26, 2022

(54) ENCAPSULATION OF MATERIAL WITH PRECIOUS AND SEMI-PRECIOUS STONES

(71) Applicant: GTL Company, Tullahoma, TN (US)

(72) Inventors: Paul Gloyer, Tullahoma, TN (US); Tim Lewis, South Weber, UT (US)

(73) Assignee: GTL COMPANY, Tullahoma, TN (US)

( * ) Notice: Subject to any disclaimer, the term of this patent is extended or adjusted under 35 U.S.C. 154(b) by 0 days.

(21) Appl. No.: 16/942,424

(22) Filed: Jul. 29, 2020

(65) Prior Publication Data
US 2020/0352288 A1 Nov. 12, 2020

Related U.S. Application Data

(62) Division of application No. 15/961,348, filed on Apr. 24, 2018, now Pat. No. 10,736,388.

(60) Provisional application No. 62/490,284, filed on Apr. 26, 2017.

(51) Int. Cl.
A44C 17/00 (2006.01)
A44C 27/00 (2006.01)

(52) U.S. Cl.
CPC ............ A44C 17/006 (2013.01); A44C 27/00 (2013.01)

(58) Field of Classification Search
CPC ... A44C 17/0006; A44C 17/00; A44C 17/006; A44C 27/00
See application file for complete search history.

(56) References Cited

U.S. PATENT DOCUMENTS

| 250,379 | A | * | 12/1881 | Meyer | A44C 17/006 63/32 |
| 4,809,417 | A | * | 3/1989 | Normann, Jr. | A44C 17/003 156/60 |
| 5,090,216 | A | * | 2/1992 | Waugh | A44C 17/006 63/26 |
| 5,454,234 | A | * | 10/1995 | Karmeli | A44C 17/006 63/28 |
| 6,649,009 | B1 | * | 11/2003 | Kim | A44C 17/003 156/257 |
| 7,284,396 | B2 | | 10/2007 | Barron et al. | |
| 8,071,066 | B1 | * | 12/2011 | Laor | C30B 25/02 423/446 |
| D853,880 | S | * | 7/2019 | Williams | D11/2 |
| 2005/0237478 | A1 | * | 10/2005 | Lipawsky | G02C 11/02 351/51 |
| 2005/0274144 | A1 | * | 12/2005 | Goughnour | A44C 17/003 63/32 |
| 2006/0196858 | A1 | * | 9/2006 | Barron | B23K 26/03 219/121.69 |
| 2007/0209390 | A1 | * | 9/2007 | Malinowski | A44C 17/003 63/32 |
| 2009/0266108 | A1 | * | 10/2009 | Balme | A61G 17/007 63/1.11 |

(Continued)

OTHER PUBLICATIONS

Ingraham, C., How much is a moon rock really worth?, The Washington Post, Jun. 13, 2018, pp. 1-8.

*Primary Examiner* — Emily M Morgan
(74) *Attorney, Agent, or Firm* — Kunzler Bean & Adamson

(57) ABSTRACT

A protective apparatus includes a gemstone and a foreign material encapsulated and physically isolated within an interior space of the gemstone. The gemstone is one of a precious gemstone or a semi-precious gemstone or a semi-precious stone.

11 Claims, 5 Drawing Sheets

(56) References Cited

U.S. PATENT DOCUMENTS

| | | | |
|---|---|---|---|
| 2010/0005835 A1* | 1/2010 | Johnson, Sr. | A44C 17/006 63/36 |
| 2011/0072851 A1* | 3/2011 | Howard | C30B 25/00 63/3 |
| 2011/0226016 A1* | 9/2011 | Howard | A44C 7/00 63/12 |
| 2012/0240622 A1* | 9/2012 | Sorenson | A44C 17/006 63/1.11 |
| 2013/0239615 A1* | 9/2013 | Misra | C30B 29/04 63/32 |
| 2018/0192749 A1* | 7/2018 | Renou | A44C 17/002 |

\* cited by examiner

ENCAPSULATION OF MATERIAL WITH PRECIOUS AND SEMI-PRECIOUS STONES

CROSS-REFERENCE TO RELATED APPLICATION

This application claims the benefit of U.S. Provisional Patent Application Ser. No. 62/490,284, filed on Apr. 26, 2017, which is incorporated herein by reference.

BACKGROUND

Protecting valuable material from detrimental or damaging effects is important and valuable to consumers. The protection may include protection from tampering, theft, loss, contamination, misidentification, adulteration, and/or some combination thereof. Various ways exist for protecting valuable materials, but all exhibit shortcomings.

SUMMARY

The subject matter of the present application has been developed in response to the present state of the art, and in particular, in response to the problems and disadvantages associated with conventional techniques for protecting valuable materials that have not yet been fully solved by currently available techniques. Accordingly, the subject matter of the present application has been developed to provide embodiments of an apparatus and a method for protecting valuable materials with precious and semi-precious stones that overcome at least some of the above-discussed shortcomings of prior art techniques.

Disclosed herein is a protective apparatus. The protective apparatus includes a gemstone and a foreign material encapsulated and physically isolated within an interior space of the gemstone, wherein the gemstone is one of a precious gemstone or a semi-precious gemstone or a semi-precious stone. The preceding subject matter of this paragraph characterizes example 1 of the present disclosure.

The gemstone is polished or cut. The preceding subject matter of this paragraph characterizes example 2 of the present disclosure, wherein example 2 also includes the subject matter according to example 1, above.

The gemstone includes an opening to the interior space, wherein the opening is sealed with a sealing material. The preceding subject matter of this paragraph characterizes example 3 of the present disclosure, wherein example 3 also includes the subject matter according to any one of examples 1-2, above.

The sealing material and the gemstone is a same material. The preceding subject matter of this paragraph characterizes example 4 of the present disclosure, wherein example 4 also includes the subject matter according to example 3, above.

The gemstone entirely surrounds the foreign material and wherein the gemstone includes a volume greater than two times a volume of the foreign material. The preceding subject matter of this paragraph characterizes example 5 of the present disclosure, wherein example 5 also includes the subject matter according to any one of examples 1-4, above.

The gemstone is a synthetic precious gemstone encapsulating and physically isolating the foreign material within the interior space and the gemstone is a first gemstone. The foreign material is a second gemstone chemically different than the first gemstone. The preceding subject matter of this paragraph characterizes example 6 of the present disclosure, wherein example 6 also includes the subject matter according to any one of examples 3-5, above.

The foreign material is a non-terrestrial material. The preceding subject matter of this paragraph characterizes example 7 of the present disclosure, wherein example 7 also includes the subject matter according to any one of examples 1-6, above.

The non-terrestrial material is a lunar material. The preceding subject matter of this paragraph characterizes example 8 of the present disclosure, wherein example 8 also includes the subject matter according to any one of examples 1-7, above.

The gemstone is a synthetic precious gemstone. The preceding subject matter of this paragraph characterizes example 9 of the present disclosure, wherein example 9 also includes the subject matter according to any one of examples 1-8, above.

The gemstone is a natural precious gemstone. The preceding subject matter of this paragraph characterizes example 10 of the present disclosure, wherein example 10 also includes the subject matter according to any one of examples 1-9, above.

Disclosed herein is a method. The method includes locating the foreign material within a gemstone, wherein locating the foreign material within the gemstone comprises one of inserting the foreign material into an interior space of the gemstone or growing the gemstone around the foreign material and the foreign material within the gemstone, wherein the gemstone is one of a precious gemstone or a semi-precious gemstone or a semi-precious stone. The preceding subject matter of this paragraph characterizes example 11 of the present disclosure.

Locating the foreign material within the gemstone includes inserting the foreign material into the interior space of the gemstone. The method includes forming an opening to the interior space within the gemstone. Inserting the foreign material includes inserting the foreign material through the opening into the interior space of the gemstone. Encapsulating the foreign material includes sealing the opening of the gemstone with a sealing material. The preceding subject matter of this paragraph characterizes example 12 of the present disclosure, wherein example 12 also includes the subject matter according to example 11, above.

The method further includes polishing and cutting prior to forming the opening. The preceding subject matter of this paragraph characterizes example 13 of the present disclosure, wherein example 13 also includes the subject matter according to example 12, above.

The method further includes polishing and cutting after sealing the opening. The preceding subject matter of this paragraph characterizes example 14 of the present disclosure, wherein example 14 also includes the subject matter according to any one of examples 12-13, above.

The gemstone is a natural precious gemstone and the sealing the opening with the sealing material includes chemically growing a synthetic precious gemstone after inserting the foreign material into the interior space. The preceding subject matter of this paragraph characterizes example 15 of the present disclosure, wherein example 15 also includes the subject matter according to any one of examples 12-14, above.

The gemstone is a synthetic precious gemstone and the sealing the opening includes chemically growing the synthetic precious gemstone after inserting the foreign material into the interior space. The preceding subject matter of this paragraph characterizes example 16 of the present disclosure, wherein example 16 also includes the subject matter according to any one of examples 12-15, above.

The method further includes laser etching an identification insignia within the interior space of the precious or semi-precious gemstone or semi-precious stone. The preceding subject matter of this paragraph characterizes example 17 of the present disclosure, wherein example 17 also includes the subject matter according to any one of examples 11-16, above.

Forming the opening in the gemstone includes drilling the opening in the precious or semi-precious gemstone or semi-precious stone. The preceding subject matter of this paragraph characterizes example 18 of the present disclosure, wherein example 18 also includes the subject matter according to any one of examples 12-17, above.

The method further includes laser etching an identification insignia on an exterior surface of the precious or semi-precious gemstone or semi-precious stone. The preceding subject matter of this paragraph characterizes example 19 of the present disclosure, wherein example 19 also includes the subject matter according to any one of examples 11-18, above.

The gemstone is a first gemstone and the foreign material is a second gemstone chemically different from the gemstone. The preceding subject matter of this paragraph characterizes example 20 of the present disclosure, wherein example 20 also includes the subject matter according to any one of examples 11-19, above.

The described features, structures, advantages, and/or characteristics of the subject matter of the present disclosure may be combined in any suitable manner in one or more embodiments and/or implementations. In the following description, numerous specific details are provided to impart a thorough understanding of embodiments of the subject matter of the present disclosure. One skilled in the relevant art will recognize that the subject matter of the present disclosure may be practiced without one or more of the specific features, details, components, materials, and/or methods of a particular embodiment or implementation. In other instances, additional features and advantages may be recognized in certain embodiments and/or implementations that may not be present in all embodiments or implementations. Further, in some instances, well-known structures, materials, or operations are not shown or described in detail to avoid obscuring aspects of the subject matter of the present disclosure. The features and advantages of the subject matter of the present disclosure will become more fully apparent from the following description and appended claims, or may be learned by the practice of the subject matter as set forth hereinafter.

BRIEF DESCRIPTION OF THE DRAWINGS

In order that the advantages of the subject matter may be more readily understood, a more particular description of the subject matter briefly described above will be rendered by reference to specific embodiments that are illustrated in the appended drawings. Understanding that these drawings depict only typical embodiments of the subject matter and are not therefore to be considered to be limiting of its scope, the subject matter will be described and explained with additional specificity and detail through the use of the drawings, in which.

DETAILED DESCRIPTION

Reference throughout this specification to "one embodiment," "an embodiment," or similar language means that a particular feature, structure, or characteristic described in connection with the embodiment is included in at least one embodiment of the subject matter of the present disclosure. Appearances of the phrases "in one embodiment," "in an embodiment," and similar language throughout this specification may, but do not necessarily, all refer to the same embodiment. Similarly, the use of the term "implementation" means an implementation having a particular feature, structure, or characteristic described in connection with one or more embodiments of the subject matter of the present disclosure, however, absent an express correlation to indicate otherwise, an implementation may be associated with one or more embodiments.

Some embodiments disclosed herein are directed to the protection and presentation of a valuable material within a gemstone. Gemstones, including precious gemstones, semi-precious gemstones, semi-precious stones, amorphous gemstones, and organic gemstones, are pieces of stone (such as mineral crystal) that are used in jewelry and other adornments. Gemstones have aesthetic value to consumers based on the gemstones appearance and/or physical properties. Consumers sometimes rely on laboratories (institutes and associations) to grade and report on the quality of gemstones using various parameters, which for a diamond may includes color, cut, clarity, and carats. Gemstones may be characterized in terms of their physical properties, such as refractive index, dispersion, specific gravity, hardness, cleavage, fracture, luster, transparency, or brilliance. Such physical properties may provide protection to a foreign material as well as provide an aesthetically pleasing presentation of the foreign material.

Figure 1:
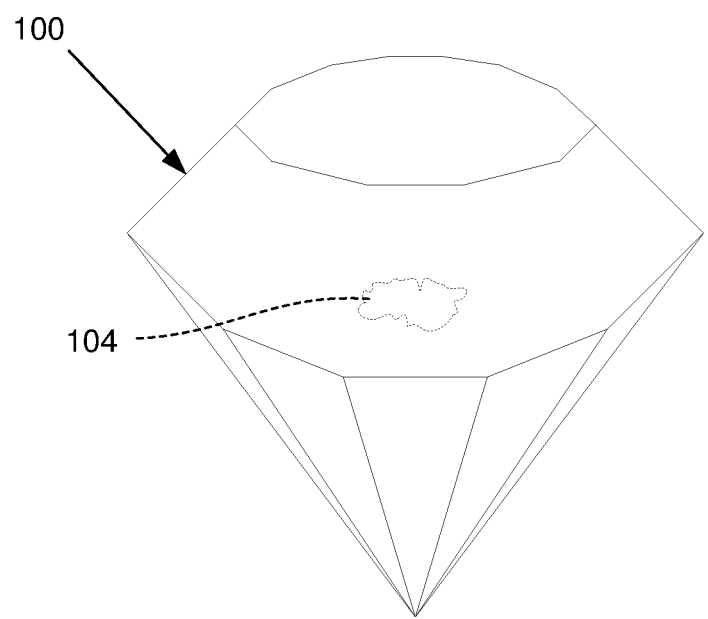
FIG. 1 is a perspective view of a gemstone, according to one or more examples of the present disclosure.

Referring to FIG. 1, a perspective view of one embodiment of a protective apparatus is shown. The protective apparatus includes a gemstone 100 and a foreign material 104 encapsulated and physically isolated (from the environment) within the gemstone 100. The gemstone 100 may be one of a precious gemstone, a semi-precious gemstone, a semi-precious stone, an amorphous gemstone, or an organic gemstone. Generally, the gemstone 100 is a stone that is configured to encapsulate a foreign material 104 and may be referred to as an encapsulation material. The gemstone 100 is configured to protect and provide an aesthetically pleasing presentation of the foreign material 104. The gemstone 100 is polished and cut. The gemstone 100 may be polished and cut prior to encapsulating the foreign material 104 and/or after encapsulating the foreign material 104.

Precious gemstones include diamonds, rubies, emeralds, or sapphires. Semi-precious gemstones include crystalline stones not classified as a precious gemstone that are transparent, semi-transparent, or translucent. Semi-precious stones include crystalline stones not classified as precious gemstones that are opaque. Amorphous gemstones include non-crystalline stones. Organic gemstones include non-mineral gemstones.

The gemstone 100 may be natural (e.g., naturally occurring) or synthetic (e.g., physically, optically, chemically identical to a natural gemstone but created in laboratory conditions). As one example, the gemstone 100 is a synthetic diamond gemstone including chemically grown crystalline carbon. In another example, the gemstone 100 is a naturally occurring gemstone mineral, such as natural diamond. Therefore, the gemstone 100 may be a naturally occurring gemstone mineral or a synthetic gemstone mineral. As contemplated herein, a synthetic gemstone includes a material made in a laboratory, but which shares virtually all chemical, optical, and physical characteristics of a natural counterpart.

According to some implementations, the gemstone 100, whether naturally occurring or synthetic, is a precious gemstone. Precious gemstones include diamonds, rubies, emeralds, or sapphires. In some implementations, the gemstone 100, whether naturally occurring or synthetic, is a semi-precious gemstone. In some implementations, the gemstone 100, whether naturally occurring or synthetic, is a semi-precious stone. Examples of semi-precious gemstones and semi-precious stones may include, but are not limited to, Agate, Amber, Amethyst, Citrine, Jade, Garnet, Aquamarine, Quartz, Beryl, Alexandrite, Serendibite, Grandidierite, Taaffeite, Musgravite, Benitoite, Poudretteite, Jeremejevite, etc. The above list is not an exhaustive list of semi-precious gemstones and semi-precious stones, and the scope of embodiments of the present subject matter should not be limited to those specifically enumerated herein. In some embodiments, the foreign material is encapsulated in other encapsulation materials, such as amorphous gemstones (e.g. zircon, opal, etc.), or organic gemstones (e.g. ivory, coral).

In some embodiments, the gemstone 100 entirely surrounds the foreign material 104 to encase the foreign material 104 and protect the foreign material 104 from external contaminants.

Figure 2:
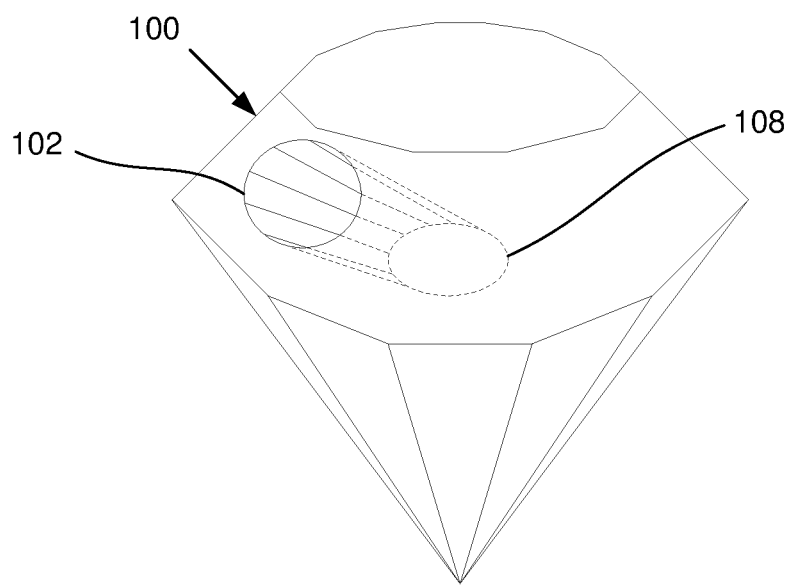
FIG. 2 is a perspective view of the gemstone with a cut made or formed in the gemstone, according to one or more examples of the present disclosure.

In some embodiments, the gemstone 100 includes an opening 102 on a surface of the gemstone 100 allowing access to the interior space 108. In other embodiments, the gemstone 100 is formed directly around the foreign material 104 without any opening 102. Referring to FIG. 2, the gemstone 100 includes an opening 102 formed into the gemstone 100. The opening 102 allows access to an interior space 108 of the gemstone 100. In some embodiments, the opening 102 is cut into the gemstone 100. In other embodiments, the opening 102 is formed using any of a variety of methods other than cutting. The opening 102, in some implementations, is laser cut, drilled, shaped, and/or grown to form the opening 102. The interior space 108 can be formed in the same or a similar manner. For example, during the growing of a synthetic gemstone in a laboratory, the growth may be constrained or compelled to form the opening 102 and the interior space 108 within the gemstone 100. In another example, the opening 102 is drilled into the gemstone 100 as may occur with a natural gemstone. The size and location of the interior space 108 may vary depending on the characteristics of a material to be inserted into the interior space 108 (see, e.g., the foreign material 104 in FIG. 3). The interior space 108 may be centered in the gemstone 100 or located in another suitable interior location within the gemstone 100 that permits or allows a visual inspection of the interior space 108, as well as protects the interior space 108. In some embodiments, the opening 102 is formed or cut into the top surface of the gemstone 100. The opening 102 may also be formed or cut into a side surface of the gemstone 100. The opening 102, in other embodiments, may be formed or cut into a bottom surface of the gemstone 100. Some embodiments may include more than one opening 102 to allow for the insertion of more than one foreign material into the gemstone 100. The opening 102, in some embodiments may be less than 0.1 mm. In other embodiments, the opening 102 is larger than 1 mm. In some embodiments, the opening 102 may be between 0.1 mm and 1 mm.

Figure 3:
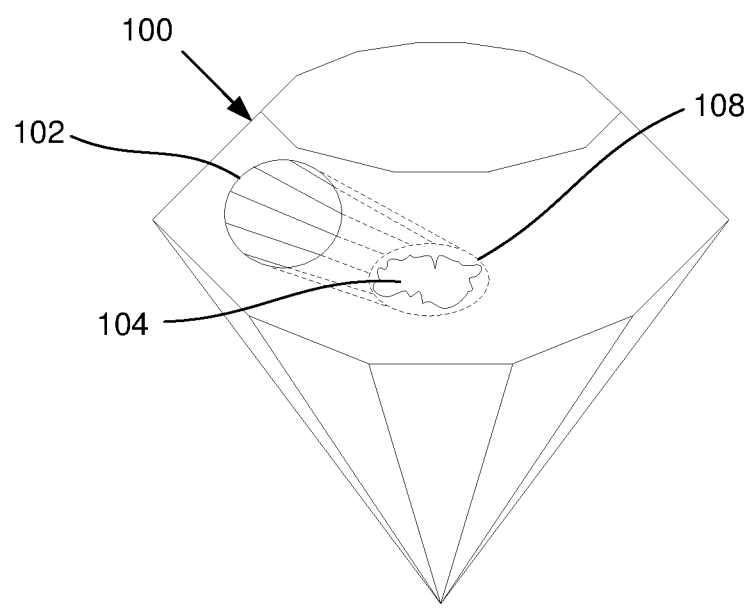
FIG. 3 is a perspective view of the gemstone with a material foreign to the gemstone inserted into an interior space of the gemstone, according to one or more examples of the present disclosure.

Referring to FIG. 3, a foreign material 104 is inserted into the interior space 108 of the gemstone 100. In some embodiments, the foreign material 104 is a non-terrestrial or extra-terrestrial material, including but not limited to, lunar material (moon rock or lunar rock/glass/metal etc.), meteorite, or other non-terrestrial matter originating from any location outside of the Earth's atmosphere, including the Moon, the Planets, dwarf planets, moons, asteroids, meteors, comets, stars, and/or other celestial objects. Moon rocks and other non-terrestrial materials brought to the Earth may be extremely valuable but, in many instances, may be difficult to distinguish from ordinary terrestrial material. Determining the origin of a material and protecting such material from tampering, theft, loss, contamination, misidentification, adulteration etc. may prove valuable and important to a consumer. Such protection, according to embodiments described herein, may be provided by a gemstone 100. While moon rock may look indistinguishable from ordinary terrestrial rock, encapsulating the moon rock in a precious or semi-precious gemstone may enhance the beauty or sentimental value of an already valuable material while protecting the moon rock from misidentification or tampering.

While the illustrated embodiment depicts moon rock as the foreign material 104, which is inserted into the interior space of gemstone 100, the foreign material 104 may be a terrestrial material, having an aesthetic or sentimental value to a consumer. The foreign material 104 is a protected and presented within an interior space of the gemstone 100. The foreign material 104, in some implementations, may include, but is not limited to, rocks, minerals, crystals, other gemstones, glasses, ceramics, metals, alloys, polymers, liquids, gases and/or some combination thereof.

The foreign material 104 may be prepared by any of various means prior to inserting the foreign material 104 into the gemstone 100. For example, a moon rock may be cut, ground, broken, crushed, shaped, melted, or otherwise processed into a size and/or shape to accommodate the interior space of the gemstone 100. For extremely valuable material, the size/amount of material to be inserted into and protected within a gemstone need not be large.

In some embodiments, an identification insignia may be inscribed to identify gemstone 100 and/or the foreign material 104. In some embodiments, the interior space of the gemstone 100 may be permanently laser etched with an identification insignia to identify the gemstone 100, the foreign material 104, the owner, and/or any other identifying information that may be used to protect or prove the authenticity and/or value of the gemstone 100 and foreign material 104. In some embodiments, the identification insignia may be etched into the surface of the interior space prior to inserting the foreign material 104. In some embodiments, the identification insignia may be etched on the exterior of the gemstone 100. In some implementations, the identification insignia may be etched on the exterior of the gemstone 100 after insertion of the foreign material 104. In some embodiments, an identification device is inserted into the interior space along with the foreign material 104. The identification device may include a device that transmits a signal out of the gemstone 100 that uniquely identifies the foreign material 104. The identification device may be a RFID device, such as a micro RFID chip, or other near field communication technology. An identification device may be necessary to identify the foreign material 104 when an opaque semi-precious stone is used to encapsulate the foreign material.

Figure 4:
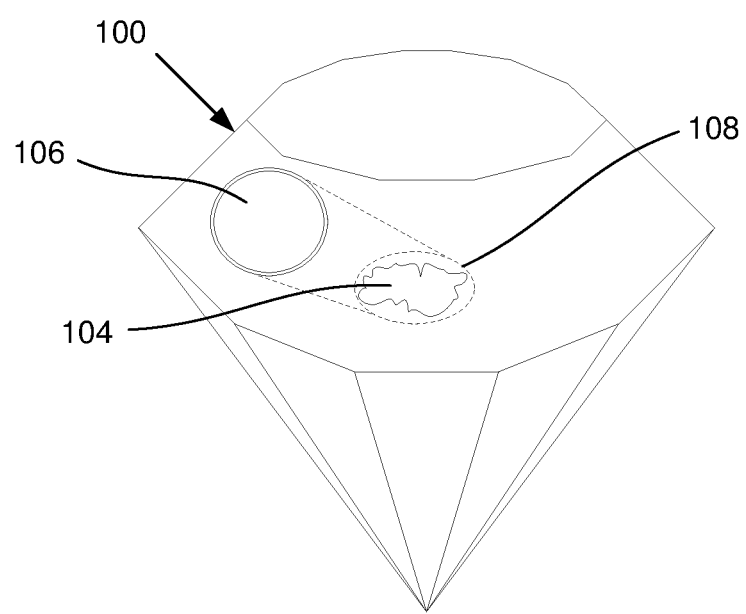
FIG. 4 is a perspective view of the gemstone with the material foreign to the gemstone sealed within the interior space of the gemstone, according to one or more examples of the present disclosure.

In some embodiments, the opening 102 is sealed with a sealing material 106. Referring to FIG. 4, the gemstone 100 is shown with the opening 102 sealed by a sealing material 106 (e.g., a cap) to fully encapsulate the foreign material 104 within the interior space of the gemstone 100. With the foreign material 104 encapsulated within the gemstone 100, the gemstone physically isolates and protects the foreign material 104 from external elements while providing a pleasing presentation of the foreign material 104. In some embodiments, the sealing material 106 is formed, to seal the interior space 108 by growing a synthetic gemstone, similar to the original gemstone 100, within the opening 102. As the synthetic gemstone grows within the opening 102, the interior space 108 and the foreign material 104 is sealed within and protected from external elements.

In some embodiments, the sealing material 106 and the gemstone 100 is a same material. As an example, the gemstone 100 may be a natural diamond with a drilled or cut opening 102 and the sealing material 106 may be a synthetic diamond grown in the opening 102. In another example, the gemstone 100 may be a sapphire and the sealing material 106 may be a second sapphire that is adhered to the gemstone 100 within the opening 102.

In some embodiments, the opening may be sealed by positioning another piece of synthetic gemstone within the opening and chemically bonding the other piece of synthetic gemstone. In some embodiments, the opening is filled with a different material than that of the original gemstone to seal the interior space. After enclosing the foreign material 104 within the gemstone 100, the gemstone 100 may be cut and polished in a manner known to those skilled in the art for preparing jewelry.

In some embodiments, the gemstone 100 is a synthetic precious gemstone encapsulating and physically isolating the foreign material within the interior space and foreign material a different precious gemstone. As an example, the gemstone 100 may be a synthetic diamond encapsulating a ruby.

In some embodiments, the foreign material 104 is a non-terrestrial material. As an example, the non-terrestrial material may be lunar material (e.g., rock, glass, metal, etc.). In some embodiments, the foreign material 104 is a terrestrial material. In some embodiments, the gemstone 100 is a synthetic precious gemstone encapsulating and physically isolating the foreign material within the interior space. In some embodiments, the gemstone is a natural precious gemstone encapsulating and physically isolating the foreign material within the interior space.

The gemstone has physical properties that can provide physical protection to the foreign material 104 while also providing an aesthetically pleasing presentation of the foreign material 104. Physical properties of the gemstone 100 that may provide for protection include hardness, strength, chemical resistance, thermal resistance, etc. In some embodiments, the foreign material 104 is physically isolated from the surrounding environment by the gemstone 100. In some embodiments, the gemstone 100 is not a thin coating but includes a significantly larger volume than a volume of the foreign material. In some implementations, the gemstone 100 includes a volume greater than two times a volume of the foreign material 104. In some implementations, the gemstone 100 includes a volume ten times greater than a volume of the foreign material 104.

Various examples are described herein. In a first example, non-terrestrial material is acquired from the Moon. The non-terrestrial material includes rock, mineral, glass, and/or metal. The non-terrestrial material is cut, ground, broken, crushed, shaped, and/or melted into smaller pieces. Synthetic diamond gemstone including crystalline carbon is cut, drilled, shaped, and/or grown to allow insertion of the small piece of non-terrestrial material into the diamond. The opening in the diamond is sealed to encapsulate, contain, enclose, or physically isolate the non-terrestrial material. The sealing is accomplished by one of many methods including, but not limited to, chemical growth of diamond in the opening, chemical bonding another piece of diamond to cover opening, or filling the opening with a non-diamond material. The diamond encapsulating the non-terrestrial material is cut and polished into a gemstone. The diamond gemstone encapsulating the non-terrestrial material is then mounted in jewelry.

In a second example, a synthetic sapphire or ruby gemstone including the mineral corundum, an aluminum oxide, is cut, drilled, shaped, and/or grown to allow insertion of the small piece of non-terrestrial material into the gemstone. The opening in the sapphire or ruby gemstone is sealed to encapsulate, contain or enclose the non-terrestrial material. The sealing is accomplished by one of many methods including, but not limited to, chemical growth of corundum in the opening, chemical bonding another piece of corundum to cover the opening, or filling the opening with non-corundum material. The sapphire or ruby encapsulating the non-terrestrial material is cut and polished into a gemstone. The sapphire or ruby gemstone encapsulating the non-terrestrial material is then mounted in jewelry.

In a third example, a synthetic emerald gemstone including the mineral beryl is cut, drilled, shaped, and/or grown to allow insertion of the small piece of non-terrestrial material, as described in the first example, into the gemstone. The opening in the emerald gemstone is sealed to encapsulate, contain or enclose the non-terrestrial material. The sealing is accomplished by one of many methods including, but not limited to, chemical growth of beryl in the opening, chemical bonding another piece of beryl to cover the opening, or filling the opening with non-beryl material. The emerald encapsulating the non-terrestrial material is cut and polished into a gemstone. The emerald gemstone encapsulating the non-terrestrial material is mounted in jewelry.

In a fourth example, a synthetic or natural semi-precious amber is cut, drilled, shaped, and/or grown to allow insertion of the small piece of non-terrestrial material, as described in the first example, into the gemstone. The opening in the amber is sealed to encapsulate, contain, or enclose the non-terrestrial material. The sealing is accomplished by one of many methods including, but not limited to, chemical growth of amber in opening, chemical bonding another piece of amber to cover opening, or filling opening with non-amber material. The amber encapsulating the non-terrestrial material is smoothed and polished into a gemstone. The amber gemstone encapsulating the non-terrestrial material is mounted in jewelry.

In a fifth example, a synthetic or natural semi-precious amethyst and/or quartz is cut, drilled, shaped, and/or grown to allow insertion of the small piece of non-terrestrial material, as described in the first example, into the gemstone. The opening in the amethyst and/or quartz is sealed to encapsulate, contain or enclose the non-terrestrial material.

The sealing is accomplished by one of many methods including, but not limited to, chemical growth of amethyst and/or quartz in the opening, chemical bonding another piece of amethyst and/or quartz to cover the opening, or filling the opening with non-amethyst and/or quartz material. The amethyst and/or quartz encapsulating the non-terrestrial material is cut and/or smoothed and polished into a gemstone. The amethyst and/or quartz gemstone encapsulating the non-terrestrial material may be mounted in jewelry.

In a sixth example, a gemstone 100 is grown around the foreign material 104 using chemical vapor deposition or another similar mechanism. In implementations where the gemstone 100 is grown around the foreign material 104, there is no need to drill or otherwise create an opening or plug an opening. In one implementation, a diamond is grown around a foreign material 104. In one implementation, a pearl is grown around a foreign material 104.

Figure 5:
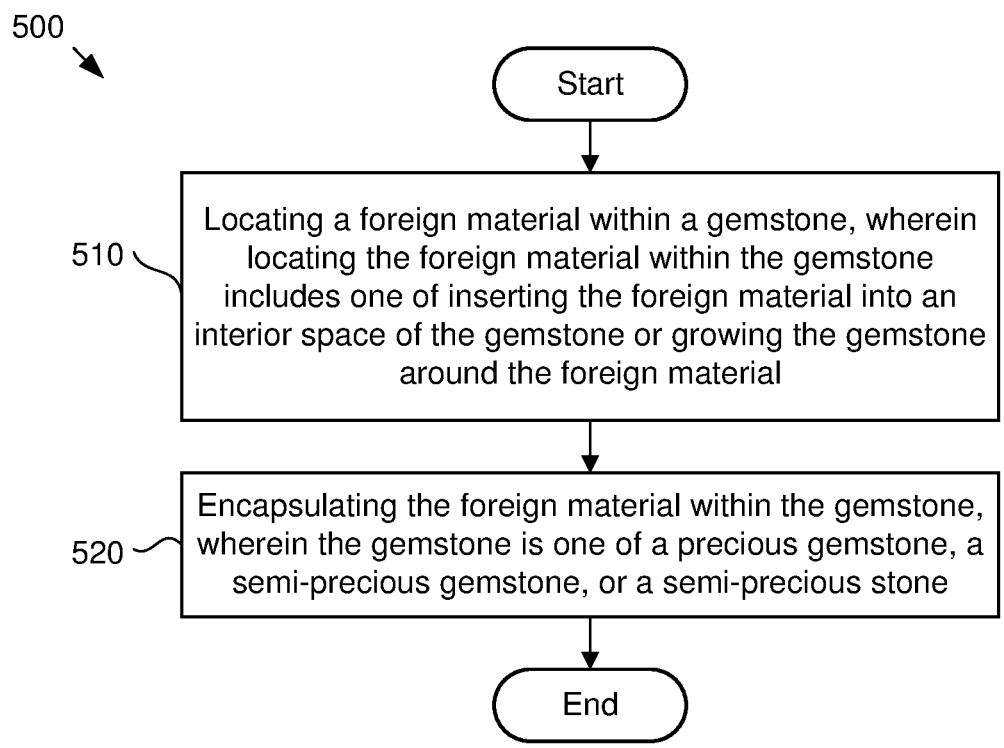
FIG. 5 is a schematic flowchart diagram of one embodiment of a method for encapsulating a material in a gemstone, according to one or more examples of the present disclosure.

Methods for protecting a foreign material are disclosed herein. Referring to FIG. 5, a schematic flowchart diagram of one embodiment of a method 500 for protecting a foreign material is shown. The method 500 includes locating 510 the foreign material within a gemstone, wherein locating the foreign material within the gemstone includes one of inserting the foreign material into an interior space of the gemstone or growing the gemstone around the foreign material, encapsulating 520 the foreign material within the gemstone. The gemstone is one of a precious gemstone, a semi-precious gemstone, or a semi-precious stone. The method then ends.

In some embodiments, locating the foreign material within the gemstone includes inserting the foreign material into the interior space of the gemstone. In some embodiments, the method includes forming an opening to the interior space within the gemstone. In some embodiments, inserting the foreign material includes inserting the foreign material through the opening into the interior space of the gemstone. In some embodiments, encapsulating the foreign material includes sealing the opening of the gemstone with a sealing material.

In some embodiments, the method includes polishing and cutting prior to forming the opening. In some embodiments, the method includes polishing and cutting after sealing the opening. In some embodiments, the gemstone is a natural precious gemstone and the sealing the opening with the sealing material includes chemically growing a synthetic precious gemstone in the opening after inserting the foreign material into the interior space. In some embodiments, the gemstone is a synthetic precious gemstone and the sealing the opening includes chemically growing the synthetic precious gemstone in the opening after inserting the foreign material into the interior space of the gemstone.

In some embodiments, the method further includes laser etching an identification insignia within the interior space of the precious or semi-precious gemstone or semi-precious stone. In some embodiments, the method further includes laser etching an identification insignia on an exterior surface of the precious or semi-precious gemstone or semi-precious stone.

In some embodiments, the forming the opening in the gemstone includes drilling the opening in the gemstone. In some embodiments, the gemstone is a first gemstone and the foreign material is a second gemstone chemically different from the gemstone.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

In the above description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object. Further, the terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise. Further, the term "plurality" can be defined as "at least two."

As used herein, a system, apparatus, structure, article, element, component, or hardware "configured to" perform a specified function is indeed capable of performing the specified function without any alteration, rather than merely having potential to perform the specified function after further modification. In other words, the system, apparatus, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware which enable the system, apparatus, structure, article, element, component, or hardware to perform the specified function without further modification. For purposes of this disclosure, a system, apparatus, structure, article, element, component, or hardware described as being "configured to" perform a particular function may additionally or alternatively be described as being "adapted to" and/or as being "operative to" perform that function.

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

As used herein, the phrase "at least one of", when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required. For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

The present subject matter may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for protecting a lunar material, the method comprising:
    locating the lunar material within a gemstone, comprising:
    forming an opening in the gemstone that extends from an exterior surface of the gemstone to an interior space within the gemstone, wherein the opening is circumferentially closed by the gemstone,
    inserting the lunar material through the opening into the interior space of the gemstone after forming an opening; and
    encapsulating the lunar material within the gemstone by sealing the opening of the gemstone with a sealing material such that the sealing material seals the interior space from the exterior surface and the lunar material is physically isolated within the interior space;
    wherein the gemstone is one of a precious gemstone, a semi-precious gemstone, or a semi-precious stone; and
    wherein the lunar material has a maximum dimension of less than or equal 1.0 mm.

2. The method of claim 1, further comprising polishing and cutting prior to forming the opening.

3. The method of claim 1, further comprising polishing and cutting after sealing the opening.

4. The method of claim 1, wherein:
    the gemstone is a natural precious gemstone; and
    sealing the opening with the sealing material comprises chemically growing a synthetic precious gemstone in the opening after inserting the foreign material into the interior space of the gemstone.

5. The method of claim 1, wherein:
    the gemstone is a synthetic precious gemstone; and
    sealing the opening comprises chemically growing a synthetic precious gemstone material in the opening after inserting the foreign material into the interior space of the gemstone.

6. The method of claim 1, wherein the method further comprises laser etching an identification insignia within the interior space of the gemstone.

7. The method of claim 1, wherein forming the opening in the gemstone comprises drilling the opening in the gemstone.

8. The method of claim 1, wherein the lunar material has a maximum dimension of less than or equal to 0.1 mm.

9. The method of claim 1, wherein the step of sealing the opening with the sealing material comprises:
    positioning the sealing material within the opening; and
    adhering the sealing material to a portion of the gemstone defining the opening.

10. The method of claim 1, wherein the opening has a maximum cross-sectional dimension between 0.1 mm and 1 mm.

11. The method of claim 1, wherein the opening has a maximum cross-sectional dimension less than 0.1 mm.

* * * * *